US006189125B1

(12) United States Patent
Classon

(10) Patent No.: US 6,189,125 B1
(45) Date of Patent: Feb. 13, 2001

(54) METHOD COMMUNICATION SYSTEM AND PHONE FOR SYSTEMATIC ENCODING AND COMPUTATIONALLY EFFICIENT DECODING FOR MINIMIZING ERROR PROPAGATION

(75) Inventor: Brian Keith Classon, Streamwood, IL (US)

(73) Assignee: Motorola, Inc., Schaumburg, IL (US)

( * ) Notice: Under 35 U.S.C. 154(b), the term of this patent shall be extended for 0 days.

(21) Appl. No.: 09/106,875

(22) Filed: Jun. 30, 1998

(51) Int. Cl.[7] .................................................. H03M 13/00
(52) U.S. Cl. .............................................................. 714/783
(58) Field of Search .................................... 714/783, 800,
714/781, 780, 746, 752, 758, 712, 807;
341/143; 375/262, 341

(56) References Cited

U.S. PATENT DOCUMENTS

| 3,622,982 | * 11/1971 | Clark, Jr. ............................... 714/783 |
| 4,389,677 | 6/1983 | Rushby et al. ........................ 358/280 |
| 4,397,022 | 8/1983 | Weng et al. ........................... 714/783 |
| 4,414,667 | 11/1983 | Bennett .................................... 371/37 |
| 4,613,860 | 9/1986 | Currie et al. .......................... 714/783 |
| 4,648,091 | 3/1987 | Gaijar ...................................... 714/783 |
| 4,926,169 | 5/1990 | Tong et al. ............................. 714/783 |
| 5,548,684 | 8/1996 | Wang et al. ............................. 395/21 |
| 5,606,569 | 2/1997 | MacDonald et al. ................. 714/758 |

OTHER PUBLICATIONS

"The Theory of Error–Correcting Codes. " F.J. Mac Williams and N. J. A. Sloane, Bell Laboratories, Murray Hill. Wlsevier Science Publishers, 1977, pp. 63–67.

Amrani, Ofer, Yair Be'ery, Alexander Vardy, Feng–Wen Sun, and Henk C.A. van Tilborg, "The Leech Lattice and the Golay Code: Bounded–Distance Decoding and Multilevel Constructions",IEEE Transactions on Informantion Theory, vol. 40, No. 4, Jul. 1994, pp. 1030–1043.

Vardy, Alexander, "Even More Efficient Bounded–Distance Decoding of the Hexacode, the Golay Code, and the Leech Lattice", IEEE Transactions of Information Theory, vol. 41, No. 5, Sep. 1995, pp. 1495–1499.

Vardy, Alexander and Yair Be'ery, "More Efficient Soft Decoding of the Golay Codes", IEEE Transactions of Information Theory, vol. 37, No. 3, May 1991, pp. 667–672.

Lin, Shu and Daniel J. Costello, Jr. "Error Control Coding Fundamentals and Applications", Prentice–Hall, Inc. Englewood Cliffs, New Jersey, pp. 65–68.

Costello, Daneil J., "Construction of Good Convoluntional Codes", Prentice–Hall, Inc., Englewood Cliffs, New Jersey, 1983, p. 329.

* cited by examiner

Primary Examiner—Christine T. Tu
(74) Attorney, Agent, or Firm—K. Cyrus Khosravi

(57) ABSTRACT

The present invention provides a method (600), phone (209), and communication system (202) including a systematic encoder (204) adapted to receive input data signals having a first plurality of data bits and generate encoded data signals having the first plurality of data bits and a first plurality of parity bits, a receiver (206) adapted to receive the encoded data signals and to generate values defining the encoded data signals, a decoder (208) coupled to the receiver (206) and adapted to generate a second plurality of data bits in response to the values defining the encoded data signals, and a post-decoder circuit (210) coupled to the decoder (208) adapted to receive the second plurality of data bits and for transforming the second plurality of data bits into an estimate of the first plurality of data bits.

15 Claims, 5 Drawing Sheets

THE 12 DATA BITS OF THE INPUT DATA SIGNALS

| 1 | 2 | 3 | 4 | 5 | 6 | 7 | 8 | 9 | 10 | 11 | 12 |

THE 12 DATA BITS IN THE 24 BIT CODEWORD

| 1 | 2 | 3 | 4 | | 6 | 7 | 8 | | 10 | 11 | 12 | 5 | | | | 9 | | | | | | | |

THE 12 PARITY BITS IN THE 24 BIT CODEWORD

| | | | | 13 | | | | 17 | | | | | 14 | 15 | 16 | | 18 | 19 | 20 | 21 | 22 | 23 | 24 |

THE 24 BIT CODEWORD AT THE OUTPUT OF THE SYSTEMATIC
GOLAY ENCODER REPRESENTED AS A 4 x 6 MATRIX

| 1 | 13 | 17 | 5  | 9  | 21 |
| 2 | 6  | 10 | 14 | 18 | 22 |
| 3 | 7  | 11 | 15 | 19 | 23 |
| 4 | 8  | 12 | 16 | 20 | 24 |

METHOD COMMUNICATION SYSTEM AND PHONE FOR SYSTEMATIC ENCODING AND COMPUTATIONALLY EFFICIENT DECODING FOR MINIMIZING ERROR PROPAGATION

RELATED INVENTIONS

The present invention is related to the following inventions which are assigned to the same assignee as the present invention:

"METHOD, COMMUNICATION SYSTEM, PHONE, AND RADIO TRANSMITTER UTILIZING NONSYSTEMATICALLY SHORTENED CODE ENCODER AND DECODER", having Ser. No. 09/109,161, filed concurrently herewith.

"METHOD, SYSTEM, APPARATUS, AND PHONE FOR ERROR CONTROL OF GOLAY ENCODED DATA SIGNALS", having Ser. No. 09/109,349 filed concurrently herewith.

The subject matter of the above-identified related inventions are incorporated by reference into the disclosure of the present invention.

FIELD OF THE INVENTION

The present invention generally relates to minimizing error propagation in a communications system, and more particularly to a systematic encoding and computationally efficient decoding in a communications system.

BACKGROUND OF THE INVENTION (24,12) Golay code encoders and decoders based on the non-binary hexacode have been used in the communication systems for error handling. The family of hexacode-based Golay decoders is very valuable because of the low complexity involved in soft-decision decoding of the popular (24,12) Golay code. The hexacode-based Golay decoders can also accept hard inputs, and are less complex than other hard-decision Golay decoders. The drawback of the hexacode-based Golay decoders is that the Golay code must be represented in a very particular format. Encoding of information packets to be decoded with a hexacode-based Golay decoder is accomplished by a multi-level hexacode based Golay encoder, as described in a paper by O. Amrani, Y. Be'ery, A, Vardy, F. Sun, and H. van Tilborg entitled: "The Leech lattice and the Golay code: Bounded Distance Decoding and Multi-level Constructions", IEEE Trans. Inform. Theory, Vol. IT-40, pp. 1030–1043, July 1994. The multi-level Golay encoder is non-systematic, such that the input bits to the encoder do not appear within the output bits of the encoder. Non-systematic encoders cause a slightly worse decoded information bit error rate (BER) than systematic encoders due to error propagation.

Thus there is a need for a communication system that provides for a systematic encoder for the hexacode-based Golay decoders.

DETAILED DESCRIPTION OF A PREFERRED EMBODIMENT

Figure 1:
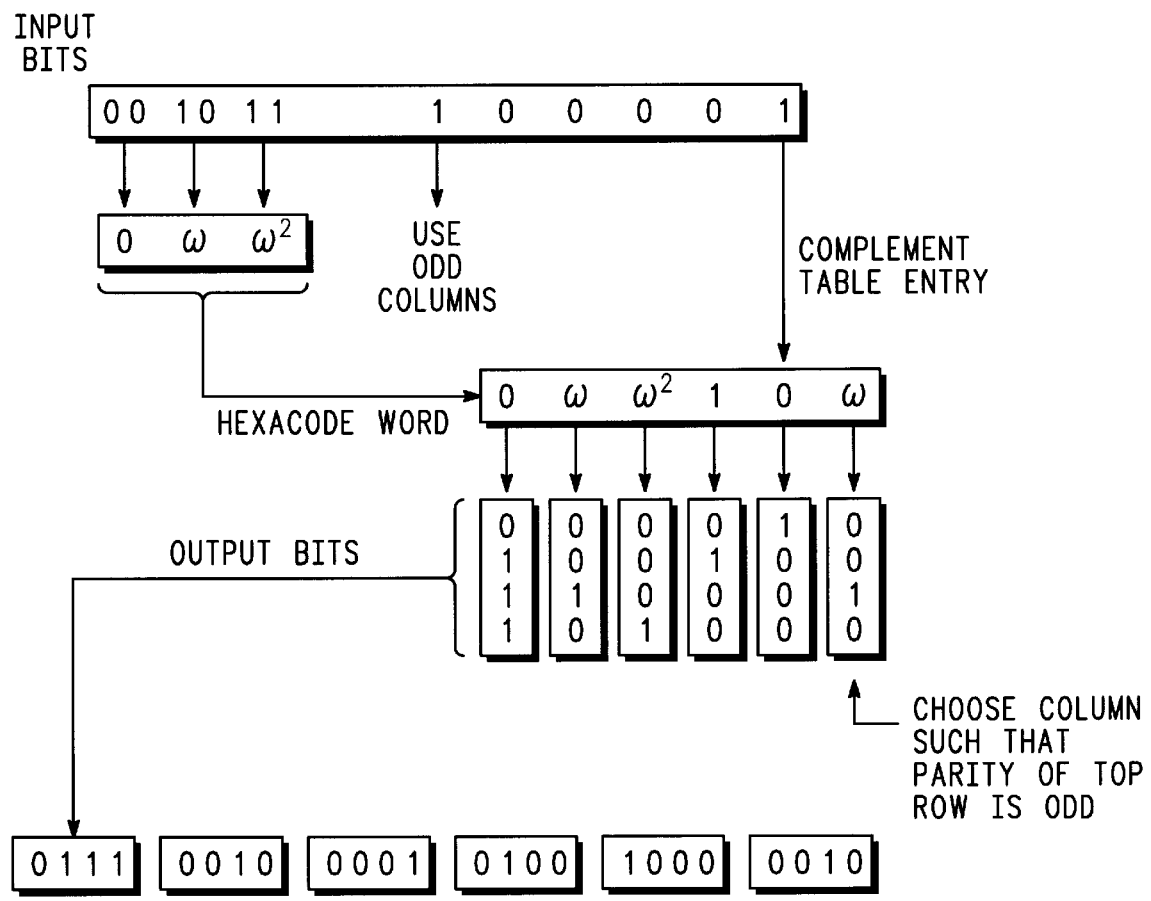
FIG. 1 is a flow diagram of a conventional mapping of 12 bits onto 24 bits using a hexacode-based multi-level Golay encoder.

The present invention in part utilizes a hexacode-based Golay decoder to provide error correction over the communications channel. The hexacode-based Golay decoder is based on a formulation referred to as an extended Golay code. The extended Golay code can be characterized as a (24,12) linear code consisting of all 4×6 binary matrices such that the following three conditions hold:

1. The parity of all the columns is the same. (All the columns have either an even or odd number of 1's.)
2. The parity of the columns equals the parity of the top row.
3. The projection of the 4×6 binary matrix onto a 1×6 non-binary array belongs to the (6,3) linear code known as the hexacode. The characters of the hexacode are derived from the Galois field $GF\{4\}=\{0, 1, \omega, \omega^2\}$. Multiplication and addition tables for $GF\{4\}$ and a systematic generator matrix for the hexacode are shown hereinbelow:

Generator matrix for the hexacode $$\begin{bmatrix} 1 & 0 & 0 & 1 & \omega^2 & \omega \\ 0 & 1 & 0 & 1 & \omega & \omega^2 \\ 0 & 0 & 1 & 1 & 1 & 1 \end{bmatrix}$$

Addition and multiplication tables for $\mathcal{GF}(4)$

| + | 0 | 1 | $\omega$ | $\omega^2$ |
|---|---|---|---|---|
| 0 | 0 | 1 | $\omega$ | $\omega^2$ |
| 1 | 1 | 0 | $\omega^2$ | $\omega$ |
| $\omega$ | $\omega$ | $\omega^2$ | 0 | 1 |
| $\omega^2$ | $\omega^2$ | $\omega$ | 1 | 0 |

| × | 0 | 1 | $\omega$ | $\omega^2$ |
|---|---|---|---|---|
| 0 | 0 | 0 | 0 | 0 |
| 1 | 0 | 1 | $\omega$ | $\omega^2$ |
| $\omega$ | 0 | $\omega$ | $\omega^2$ | 1 |
| $\omega^2$ | 0 | $\omega^2$ | 1 | $\omega$ |

For example, using Galois field arithmetic, the data vector $(0\omega\omega^2)$ encodes to the hexacode word $(0\omega\omega^2 1 0\omega)$. A 4×6 Golay code matrix is projected onto a 1×6 array of characters in $GF\{4\}$ by projecting each four bit column onto a single character. If the column is $(a_0 a_1 a_2 a_3)'$, wherein $a_0$ through $a_3$ represent binary values in a column, the corresponding character is calculated using the following projection formula: $0 \cdot a_0 + 1 \cdot a_1 + \omega \cdot a_2 + \omega^2 \cdot a_3$. Projecting a column onto a character is a many-to-one mapping. For example, (0 0 0 0)', (1 1 1 1)', (0 1 1 1)', and (1 0 0 0)' all project onto the character "0".

An example of an encoding using a hexacode-based multi-level Golay encoder is described below:

Encoding example:

A hexacode-based multi-level Golay encoder receives 12 input bits and maps the same onto a 24 bit Golay codeword (the contents of a binary 4×6 matrix). The 24 bits of the matrix are then read out into the channel columnwise. Of the 12 input bits, bits 1 to 6 are used to select a hexacode word. Since the non-binary characters of GF{4} can be represented by two bits each, these six bits specify three characters of GF{4}. The (6,3) hexacode is utilized to take these three characters and produce a six character hexacode word. For example, if the first six input bits are (00, 10, 11), the corresponding three characters are (0ωω$^2$), given that 00=0, 01=1, 10=ω, and 11=ω$^2$. Using the generator matrix of the hexacode, (0ωω$^2$) is mapped to the hexacode word having six characters (0ωω$^2$10ω). The six characters are used to generate the six four-bit columns of the Golay code matrix, such that condition 3 of the definition of the extended Golay code described above holds. That is, each four-bit column must project onto its hexacode word character. In general, there are four possible columns with which each character can be replaced, since four different columns will project onto a single character. In terms of condition 3 of the extended Golay code definition described hereinbefore, any of the four columns may be used. In order to satisfy conditions 1 and 2, however, the remaining six input bits of the twelve input bits are used to make sure that all the columns used have either even or odd parity, and that the top row has the same parity as the columns. For example, it should be appreciated that the following series of bits in a column all project to the character "0": (0 0 0 0)', (1 1 1 1)', (0 1 1 1)', and (1 0 0 0)'. It should be noted that two of the possible columns have even parity, and the other two have odd parity. Also, the two even columns are complements of each other, as are the two odd columns. The above-mentioned conditions are also applicable when mapping characters 1, ω, and ω$^2$. Thus, input bit 7 is used to determine if all the columns will have even (i.e., bit 7=0) or odd (i.e., bit 7=1) parity. This guarantees that condition 1 of the extended Golay code definition will be satisfied. Given that the column is even or odd, each of the six characters can be represented by only two possible columns. Input bits 8 through 12 are used to determine which of the two remaining columns is preferred for the first five characters in the hexacode word. Input bits 8 through 12 are referred to as the "preference bits". The last character of the hexacode word must be represented by a column which provides the top row of the 4×6 matrix to have the same parity as the columns, as dictated by the values of bit 7, namely 1 or 0. A simple encoding table depicting the series of the binary values that correspond to the non-binary hexacode characters is shown in the TABLE A below:

TABLE A

| hexacode character | 0 | 1 | ω | ω$^2$ | 0 | 1 | ω | ω$^2$ |
|---|---|---|---|---|---|---|---|---|
|  | 0 | 0 | 0 | 0 | 0 | 0 | 0 | 0 |
|  | 0 | 0 | 1 | 1 | 1 | 1 | 0 | 0 |
|  | 0 | 1 | 0 | 1 | 1 | 0 | 1 | 0 |
|  | 0 | 1 | 1 | 0 | 1 | 0 | 0 | 1 |
|  | even (bit 7 = 0) | | | | odd (bit 7 = 1) | | | |

For a given hexacode character (0,1, ω, and ω$^2$), TABLE A provides for the determination of which column to be used. In determining which column to use for each hexacode character, the preference bit corresponding to the column must be considered. The above table is prepared with the assumption that the preference bit is 0; however, when the bit signifying the preference bit is 1, then the complement of the column represented in the table is chosen as representation of the hexacode character.

For example, the input vector (001011100001) is encoded as shown in the flow diagram shown in FIG. 1. The multi-level encoding construction shown in FIG. 1 satisfies the three conditions of the extended Golay code definition. The first six input bits are used to represent 3 characters from GF{4}. These three characters are used to produce a 6 character hexacode word. Each character of the hexacode word will be used to produce a four bit column of the Golay code represented as a 4×6 matrix. Input bit 7 is a 1, so each column will be an odd representation of the corresponding character. Input bit 8 is a 0, so the preference of the first column (output bits 1 to 4) is 0 and the column selected is (0 1 1 1)'. Input bit 9 is a 0, so the preference of the second column (output bits 5 to 8) is 0 and the column selected is (0 0 1 0)'. Input bit 10 is a 0, so the preference of the third column (output bits 9 to 12) is 0 and the column selected is (0 0 0 1)'. Input bit 11 is a 0, so the preference of the fourth column (output bits 13 to 16) is 0 and the column selected is (0 1 0 0)'. Input bit 12 is a "1", so the preference of the fifth column (output bits 17 to 20) is 1 and the column selected is (1 0 0 0)'. The parity of the top row of the Golay code matrix must be odd by condition 2, so the preference of the sixth column (output bits 21 to 24) is 0 and the column selected is (0 0 1 0)'.

The hereinbefore described hexacode-based multi-level encoder is not a systematic construction wherein the 12 input bits also appear as part of the 24 output bits. Since the above-discussed Golay code construction is non-systematic, the decoded information bit error probability can be higher than that of a systematic Golay code.

Figures 2, 4:
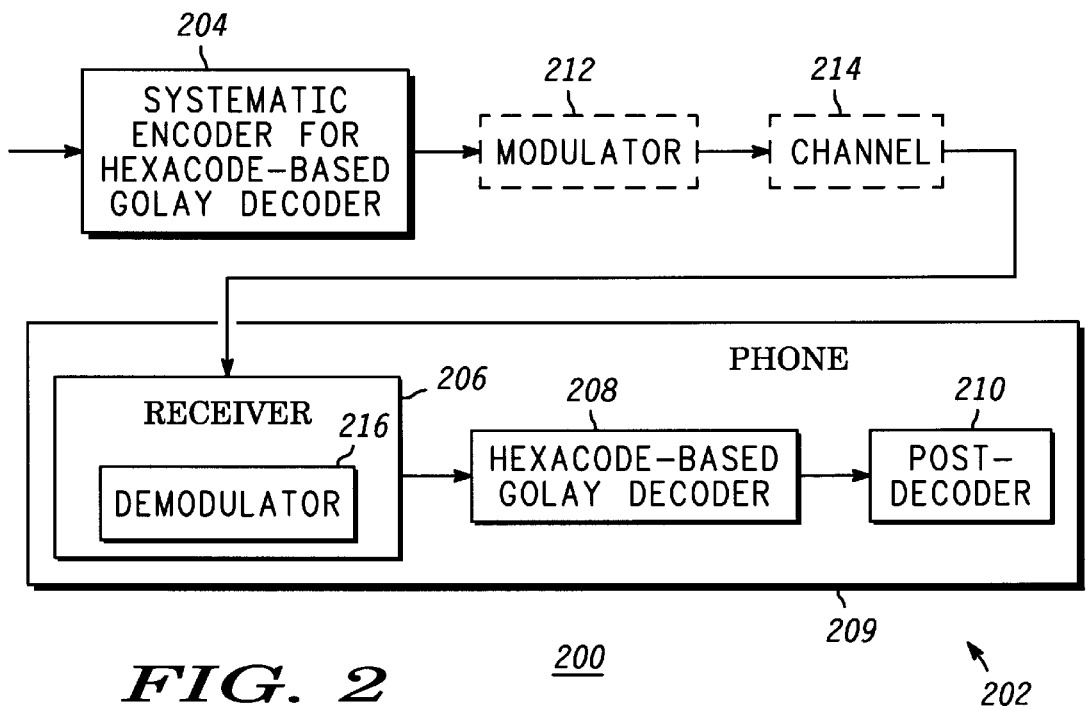
FIG. 2 is a block diagram representation of an embodiment of a communication system in accordance with the present invention.
FIG. 4 is a representation of an arrangement of twelve data bits in relation to twelve parity bits generated by the systematic Golay encoder as the Golay encoded data signals.

The present invention provides for systematic encoding for computationally efficient decoding in order to minimize error propagation in a communication system. FIG. 2, numeral 200, is a block diagram representation of an embodiment of a communication system in accordance with the present invention. Referring to FIG. 2, the communication system 202 includes a systematic encoder 204 adapted to receive input data signals having a first plurality of data bits and generate encoded data signals having the first plurality of data bits and a first plurality of parity bits, a receiver 206 adapted to receive the encoded data signals and to generate values defining the encoded data signals, a decoder 208 coupled to the receiver 206 and adapted to generate a second plurality of data bits in response to the values defining the encoded data signals, and a post-decoder circuit 210 coupled to the decoder 208 adapted to receive the second plurality of data bits and for transforming the second plurality of data bits into an estimate of the first plurality of data bits.

The receiver 206, hexacode-based Golay decoder 208, and the post-decoder 210 of the present invention can be implemented in various electronic devices such as subscriber unites/phones 209, radio receivers, and the like.

Figure 3:
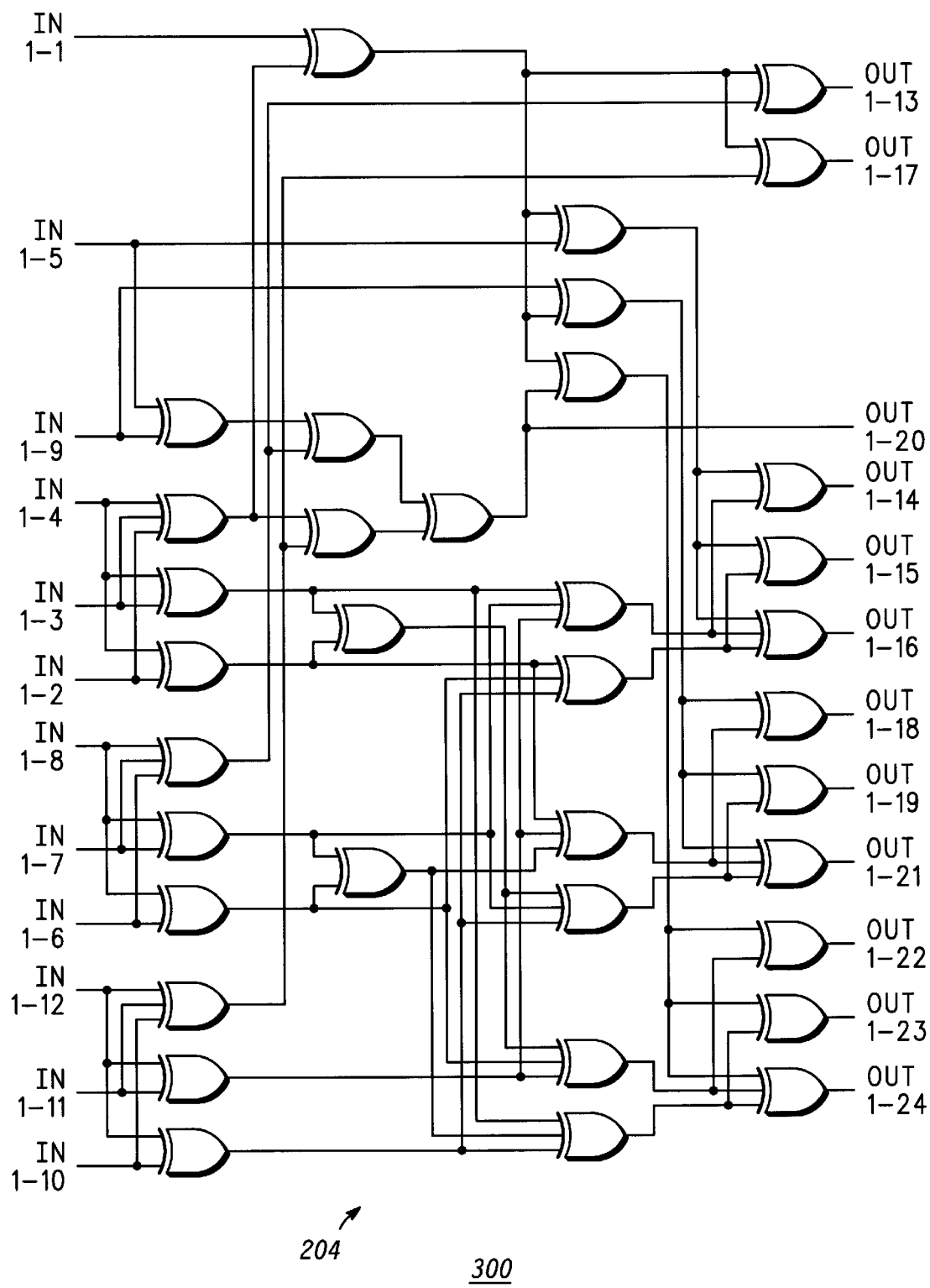
FIG. 3 is a detailed schematic representation of an embodiment of a systematic Golay encoder in accordance with the present invention.

In the preferred embodiment of the present invention, the systematic encoder 204 is a Golay encoder adapted for operation with a hexacode-based Golay decoder. FIG. 3, numeral 300, is a schematic representation of an embodiment of a systematic Golay encoder in accordance with the present invention. The systematic Golay encoder 204 requires packets of input data signals, wherein each packet includes twelve data bits. The systematic Golay encoder 204 generates Golay encoded data signals having the packet of twelve data bits and twelve parity bits. In an embodiment of the systematic Golay encoder 204 shown in FIG. 3, the packet of twelve data bits supplied to the systematic Golay encoder are shown as in1-1, in1-2, in1-3, . . . , and in1-12. Moreover, the twelve parity bits are shown as out1-13, out1-14, . . . , and out1-24. Although not shown in FIG. 3 for simplicity, it must be noted that the same packet of twelve data bits is provided as part of the output of the systematic Golay encoder 204.

It should be noted that the hexacode-based Golay decoder is not limited to using the mapping presented in TABLE A above. There are eight columns in the table (one even and one odd) for each of the four characters. There are two choices for each column because there are exactly two even columns that project to each character and two odd columns that project to each character. Therefore, there are $2_8=256$ possible ways of selecting the table. Referring to FIG. 3, it should be noted that the preferred embodiment of the systematic encoder 204 is implemented based on the mapping shown in TABLE B presented below:

TABLE B

| hexacode character | 0 | 1 | ω | ω² | 0 | 1 | ω | ω² |
|---|---|---|---|---|---|---|---|---|
| | 0 | 0 | 0 | 0 | 1 | 1 | 1 | 1 |
| | 0 | 0 | 1 | 1 | 0 | 0 | 1 | 1 |
| | 0 | 1 | 0 | 1 | 0 | 1 | 0 | 1 |
| | 0 | 1 | 1 | 0 | 0 | 1 | 1 | 0 |
| | even (bit 7 = 0) | | | | odd (bit 7 = 1) | | | |

Referring to FIG. 2, the Golay encoded data signals are modulated using a modulator 212 for transmission across a communication channel 214. The Golay encoded data signals are received by the receiver 206. The receiver 206 includes a demodulator 216 for demodulating the received Golay encoded data signals. The receiver 206 is adapted to generate values defining/representing the Golay encoded data signals. The aforementioned values may be either soft or hard values. It is contemplated that in the preferred embodiment of the present invention, the values defining the Golay encoded data signals are soft values.

FIG. 4, numeral 400, is a representation of an arrangement of twelve data bits in relation to the twelve parity bits generated by the systematic Golay encoder 204 as the Golay encoded data signals. Referring to FIG. 4, a construction of a 4×6 matrix representing the 24 bit codeword is illustrated. As shown in FIG. 4, the twelve data bits of the input data signals appear unchanged in the Golay encoded data signals as the output of the systematic Golay encoder, hence providing a systematic encoding of the input data signals.

The hexacode-based Golay decoder 208 produces 12 output bits from the 24 values defining the systematically encoded data signals. The 12 output bits are not an estimate of the input data signals, but rather an estimate of what the input data signals would have been if a hexacode-based multilevel Golay encoder had been used to encode the input data signals. Since a systematic encoder 204 is used instead of a nonsystematic hexacode-based multilevel Golay encoder, the 12 output bits need to be transformed into an estimate of the input data signals.

Figure 5:
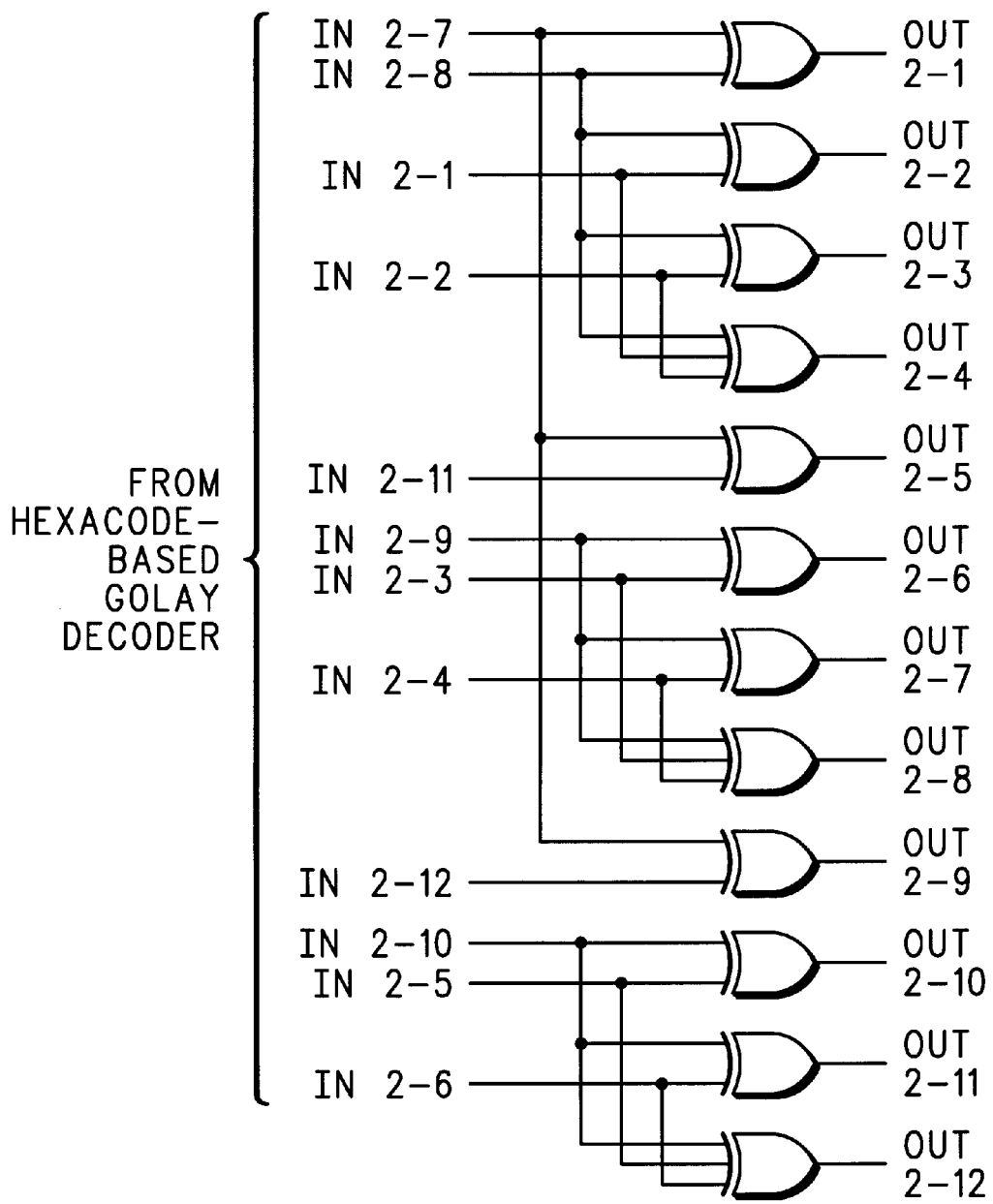
FIG. 5 is a detailed schematic representation of an embodiment of a post-decoder of the communication system in accordance with the present invention.

FIG. 5, numeral 500, is a detailed schematic representation of an embodiment of the post-decoder of the communication system in accordance with the present invention. Referring to FIG. 5, the post-decoder 210 receives the twelve output bits from the hexacode-based Golay decoder 208. The twelve output bits from the hexacode-based Golay decoder 208 are received as inputs to the post-decoder 210, wherein the inputs are represented as in2-1, in2-2, in2-3, . . . , and in2-12. The post-decoder 210 transforms the received output bits from the hexacode-based Golay decoder 208 into an estimate of the input data signals having the first plurality of data bits. The output bits from the post-decoder 210 representing an estimate of the input data signals are shown as out2-1, out2-2, out2-3, . . . , and out2-12.

Figure 6:
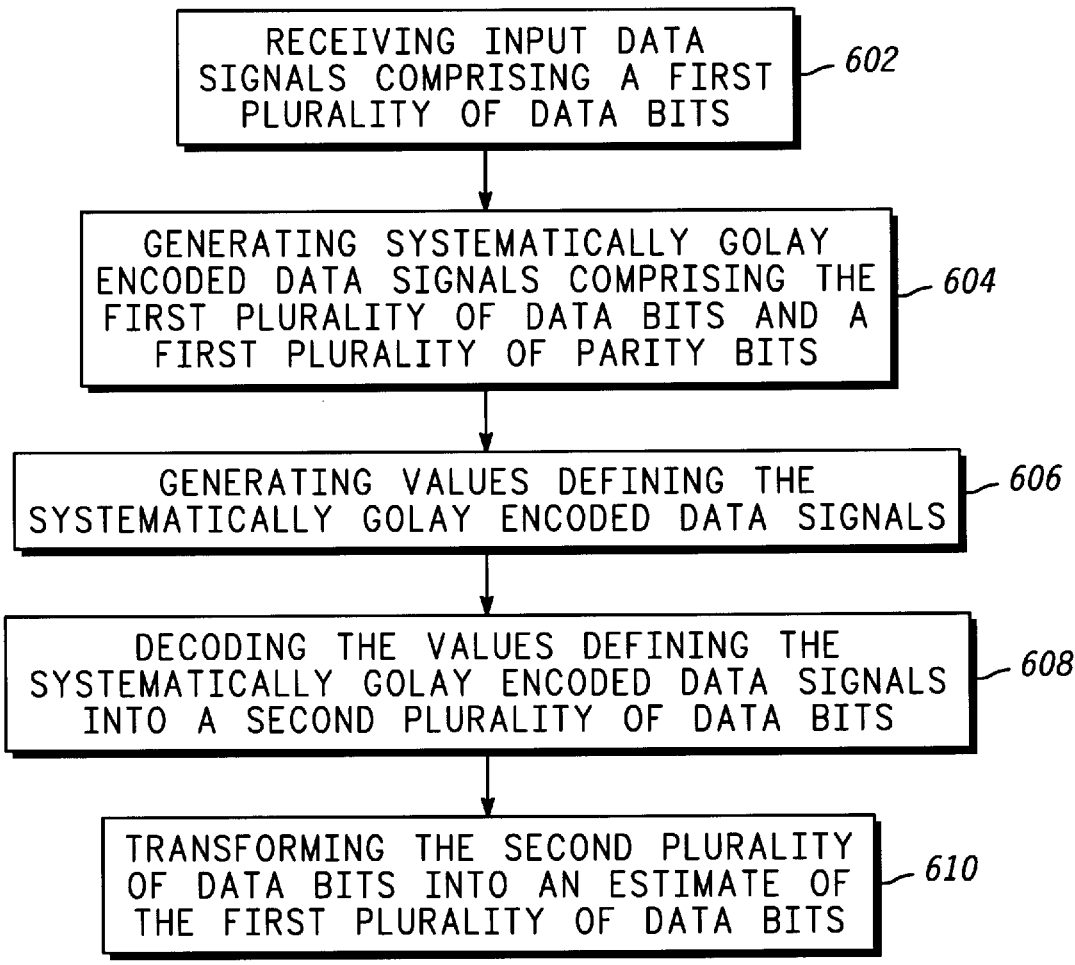
FIG. 6 is a graphic representation of one embodiment of steps of a method in accordance with the present invention.

FIG. 6, numeral 600, is a graphic representation of one embodiment of steps of a method in accordance with the present invention. The method includes the steps of: a) receiving input data signals comprising a first plurality of data bits (602); b) generating systematically Golay encoded data signals comprising the first plurality of data bits and a first plurality of parity bits (604); c) generating values defining the systematically Golay encoded data signals (606); d) decoding the values defining the systematically Golay encoded data signals into a second plurality of data bits (608); e) transforming the second plurality of data bits into an estimate of the first plurality of data bits (610).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

I claim:

1. A communication system, comprising:
   a systematic encoder adapted to receive input data signals comprising a first plurality of data bits and generate encoded data signals comprising the first plurality of data bits and a first plurality of parity bits;
   a receiver adapted to receive the encoded data signals and to generate values defining the encoded data signals;
   a decoder coupled to the receiver and adapted to generate a second plurality of data bits in response to the values defining the encoded data signals; and
   a post-decoder circuit coupled to the decoder adapted to receive the second plurality of data bits and for transforming the second plurality of data bits into an estimate of the first plurality of data bits, wherein the estimate of the first plurality of data bits and the second plurality of data bits are equal in number.

2. The communication system of claim 1, wherein the systematic encoder is a systematic Golay encoder and the encoded data signals are Golay encoded data signals.

3. The communication system of claim 2, wherein the decoder is a hexacode-based Golay decoder.

4. The communication system of claim 3, wherein the values defining the encoded data signals are soft values.

5. The communication system of claim 3, wherein the values defining the encoded data signals are hard values.

6. The communication system of claim 1, wherein the receiver comprises a demodulator.

7. A method of efficiently producing an estimate of input data signals in a communication system, comprising the steps of:
   receiving input data signals comprising a first plurality of data bits;
   generating systematically Golay encoded data signals comprising the first plurality of data bits and a first plurality of parity bits;

generating values defining the systematically Golay encoded data signals;

decoding the values defining the systematically Golay encoded data signals into a second plurality of data bits;

transforming the second plurality of data bits into an estimate of the first plurality of data bits, wherein the estimate of the first plurality of data bits and the second plurality of data bits are equal in number.

8. The method of claim 7, wherein the values defining the systematically Golay encoded data signals are soft values.

9. The method of claim 7, wherein the values defining the systematically Golay encoded data signals are hard values.

10. The method of claim 7, wherein the systematically Golay encoded data signals are generated using a systematic encoder for hexacode-based Golay decoder.

11. The method of claim 10, wherein the values defining the systematically Golay encoded data signals are decoded using a hexacode-based Golay decoder.

12. A phone for receiving encoded data signals generated by a systematic encoder adapted to receive input data signals having a first plurality of data bits, comprising:

a receiver adapted to receive the encoded data signals and to generate values defining the encoded data signals;

a decoder coupled to the receiver and adapted to generate a second plurality of data bits in response to the values defining the encoded data signals; and a post-decoder circuit coupled to the decoder adapted to receive the second plurality of data bits and for transforming the second plurality of data bits into an estimate of the first plurality of data bits, wherein the estimated of the first plurality of data bits and the second plurality of data bits are equal in number.

13. The communication system of claim 12, wherein the decoder is a hexacode-based Golay decoder.

14. The communication system of claim 13, wherein the values defining the encoded data signals are soft values.

15. The communication system of claim 13, wherein the values defining the encoded data signals are hard values.

\* \* \* \* \*